(12) United States Patent
Li

(10) Patent No.: US 11,158,839 B2
(45) Date of Patent: Oct. 26, 2021

(54) COMPOSITION FILM, MANUFACTURE METHOD THEREOF, AND LIGHT-EMITTING DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventor: Yanqiu Li, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 265 days.

(21) Appl. No.: 16/136,404

(22) Filed: Sep. 20, 2018

(65) Prior Publication Data
US 2019/0165315 A1    May 30, 2019

(30) Foreign Application Priority Data
Nov. 30, 2017   (CN) .......................... 201711242755.2

(51) Int. Cl.
*H01L 51/52* (2006.01)
*H01L 51/56* (2006.01)

(52) U.S. Cl.
CPC ...... *H01L 51/5259* (2013.01); *H01L 51/5253* (2013.01); *H01L 51/56* (2013.01)

(58) Field of Classification Search
CPC . H01L 51/56; H01L 51/5253; H01L 51/5256; H01L 51/0043; H01L 2227/323; B32B 2307/728; B32B 2307/73
USPC ........ 257/40, E51.001; 438/16, 29, 106, 763
See application file for complete search history.

(56) References Cited

U.S. PATENT DOCUMENTS

| | | | | |
|---|---|---|---|---|
| 4,407,881 | A * | 10/1983 | Shima | B44C 1/00 428/156 |
| 2011/0084944 | A1* | 4/2011 | Bae | G02B 26/004 345/205 |
| 2012/0228262 | A1* | 9/2012 | Tanaka | G11B 5/82 216/49 |
| 2019/0044081 | A1* | 2/2019 | Pentlehner | H01L 51/5056 |

* cited by examiner

*Primary Examiner* — Steven B Gauthier
*Assistant Examiner* — Christopher A Culbert
(74) *Attorney, Agent, or Firm* — Leason Ellis LLP

(57) ABSTRACT

The present disclosure provides a composite film including a hydrophobic film layer and a hydrophilic film layer, a manufacture method thereof, and a light-emitting display device. The hydrophobic film layer is in contact with the hydrophilic film layer, and the hydrophilic film layer forms folds under an action of water vapor. As such, it is possible to achieve real-time detection of whether water vapor enters a light-emitting display device formed subsequently, and thus the adverse effects of water vapor on the light-emitting display device can be eliminated timely.

13 Claims, 5 Drawing Sheets

(1) non-irradiated (2) irradiation for 5 hours
(a) 293K  (b) 303K  (c) 313K  (d) 323K  (e) 333K

COMPOSITION FILM, MANUFACTURE METHOD THEREOF, AND LIGHT-EMITTING DISPLAY DEVICE

The present application claims the priority of the Chinese Patent Application No. 201711242755.2 filed on Nov. 30, 2017, which is incorporated herein by reference as part of the disclosure of the present application.

TECHNICAL FIELD

At least one embodiment of the present disclosure relates to a composite film comprising a hydrophobic film layer and a hydrophilic film layer, its manufacture method, and a light-emitting display device.

BACKGROUND

Organic light-emitting diodes (OLEDs) have been widely used in the field of display technology owing to their advantages such as self-luminescence, no need of backlight, high contrast, small thickness, wide viewing angle, fast reaction speed, being useful in a curved surface display, wide temperature range, simple structure and process, and the like.

Lifetime of OLEDs restricts their pace of industrialization. In the process of manufacturing an OLED, a pixel definition region is formed on a base substrate, and then an organic light-emitting material is evaporated in the pixel definition region by a vacuum evaporation method. The organic light-emitting material is very sensitive to water vapor and oxygen. The existence of water vapor and oxygen has greatly reduced the lifetime and quality of OLEDs. Therefore, after evaporation, encapsulation needs to be carried out by a thin film encapsulation method or an edge coating method. Otherwise, the lifetime of OLEDs will be reduced. After encapsulation, water vapor and oxygen needs to be detected to ensure that the water vapor and oxygen do not affect the lifetime and function of OLEDs.

SUMMARY

At least one embodiment of the present disclosure provides a composite film comprising a hydrophobic film layer and a hydrophilic film layer, wherein the hydrophobic film layer is in contact with the hydrophilic film layer, and the hydrophilic film layer forms folds under an action of water vapor.

For example, in the composite film provided by at least one embodiment of the present disclosure, the hydrophobic film layer and the hydrophilic film layer are laminated, and the hydrophilic film layer comprises a first hydrophilic portion and a second hydrophilic portion, wherein the first hydrophilic portion has a hydrophilicity greater than that of the second hydrophilic portion, and the first hydrophilic portion forms folds under the action of water vapor.

For example, in the composite film provided by at least one embodiment of the present disclosure, the hydrophobic film layer and the hydrophilic film layer are arranged in a same layer; the hydrophilic film layer comprises a plurality of hydrophilic regions spaced apart from each other, and the hydrophobic film layer comprises a plurality of hydrophobic regions spaced apart from each other, wherein any two adjacent hydrophilic regions are separated by one of the hydrophobic regions.

For example, in the composite film provided by at least one embodiment of the present disclosure, the hydrophobic film layer has a modulus of from about 10 kPa to about 40 kPa.

For example, in the composite film provided by at least one embodiment of the present disclosure, the hydrophobic film layer comprises polydimethylsiloxane, and the hydrophilic film layer comprises polyvinyl alcohol.

For example, in the composite film provided by at least one embodiment of the present disclosure, a ratio of a thickness of the hydrophobic film layer to a thickness of the hydrophilic film layer is from about 1:1 to about 3:1.

At least one embodiment of the present disclosure further provides a light-emitting display device, comprising the composite film as described above and a light-emitting element.

For example, in the light-emitting display device provided by at least one embodiment of the present disclosure, the composite film is provided on at least one of a light-exiting side and an opposite side of the light-exiting side of the light-emitting element.

For example, in the light-emitting display device provided by at least one embodiment of the present disclosure, the composite film is provided on the light-exiting side of the light-emitting element, and a side of the composite film away from the light-emitting element is provided with a first barrier layer.

For example, in the light-emitting display device provided by at least one embodiment of the present disclosure, the composite film is provided on the opposite side of the light-exiting side of the light-emitting element, and a side of the composite film away from the light-emitting element is provided with a second barrier layer.

For example, in the light-emitting display device provided by at least one embodiment of the present disclosure, the hydrophobic film layer and the hydrophilic film layer are laminated; the hydrophilic film layer comprises a first hydrophilic portion and a second hydrophilic portion, wherein the first hydrophilic portion has a hydrophilicity greater than that of the second hydrophilic portion, and the first hydrophilic portion forms folds under an action of water vapor.

For example, in the light-emitting display device provided by at least one embodiment of the present disclosure, the hydrophobic film layer and the hydrophilic film layer are arranged in a same layer; the hydrophilic film layer comprises a plurality of hydrophilic regions spaced apart from each other, and the hydrophobic film layer comprises a plurality of hydrophobic regions spaced apart from each other, wherein any two adjacent hydrophilic regions are separated by one of the hydrophobic regions.

At least one embodiment of the present disclosure further provides a method of manufacturing a composite film comprising the hydrophobic film layer and the hydrophilic film layer, the method comprising: forming the hydrophobic film layer and the hydrophilic film layer sequentially, wherein the hydrophobic film layer is in contact with the hydrophilic film layer, and the hydrophilic film layer forms folds under an action of water vapor.

For example, the method according to at least one embodiment of the present disclosure further comprises crosslinking the hydrophilic film layer to form a first hydrophilic portion and a second hydrophilic portion, wherein the first hydrophilic portion has a hydrophilicity greater than that of the second hydrophilic portion, and the first hydrophilic portion forms folds under the action of water vapor.

For example, in the method according to at least one embodiment of the present disclosure, the crosslinking the hydrophilic film layer to form the first hydrophilic portion and the second hydrophilic portion comprises crosslinking a portion of the hydrophilic film layer by employing a process of ultraviolet irradiation oxidation in an oxygen environment.

For example, in the method according to at least one embodiment of the present disclosure, the forming the hydrophobic film layer and the hydrophilic film layer comprises: forming the hydrophobic film layer which has an opening; and forming the hydrophilic film layer at the opening of the hydrophobic film layer.

For example, in the method according to at least one embodiment of the present disclosure, the hydrophobic film layer comprises polydimethylsiloxane, and the hydrophilic film layer comprises polyvinyl alcohol.

BRIEF DESCRIPTION OF THE DRAWINGS

In order to clearly illustrate the technical solution of the embodiments of the present disclosure, the drawings of the embodiments will be briefly described in the following. It is obvious that the drawings described are only related to some embodiments of the present disclosure and thus are not limitative of the present disclosure.

FIG. 4-1 and FIG. 4-2 are respectively nuclear magnetic resonance spectrum of a hydrophilic film layer according to an embodiment of the present disclosure at different temperatures before and after crosslinking;

REFERENCE SIGNS

Figure 1:
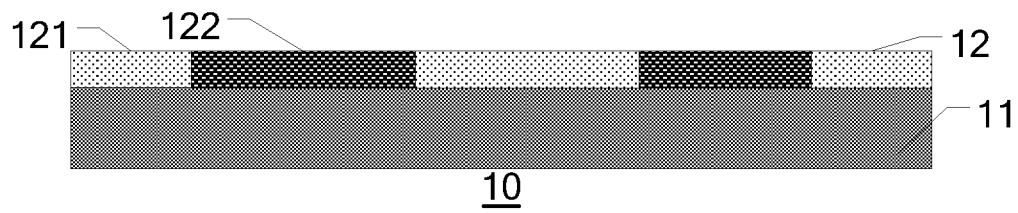
FIG. 1 is a schematic diagram of a composite film according to an embodiment of the present disclosure.

10—composite film; 11, 203—hydrophobic film layer; 12, 204—hydrophilic film layer; 121—first hydrophilic portion; 122—second hydrophilic portion; 201—base substrate; 202—first barrier layer; 205—OLED light-emitting element; 206—OLED drying layer; 207—second barrier layer; 30—mask; 31—photoresist; and 32—ultraviolet lamp.

DETAILED DESCRIPTION

In order to make objects, technical solutions and advantages of embodiments of the disclosure clearer, the technical solutions of the embodiments of the present disclosure will be described in a clear and complete way in connection with the drawings of the embodiments of the present disclosure. It is apparent that the embodiments described are just part but not all of the embodiments of the present disclosure. Based on the embodiments described herein, those skilled in the art can obtain, without any inventive work, other embodiment(s) which should be within the scope of the present disclosure.

Unless otherwise defined, the technical terms or scientific terms used herein shall have the general meanings as understood by one of ordinary skill in the art to which the present disclosure belongs. The terms "first" "second" and the like used in the present disclosure are not intended to indicate any sequence, amount or importance, but are merely used to distinguish various components. The terms "comprises" "comprising" "includes" "including" and the like are intended to specify that the elements or the objects stated before these terms encompass the elements or the objects listed after these terms as well as equivalents thereof, without excluding other elements or objects. The terms "connect", "connected", and the like are not intended to define a physical connection or mechanical connection, but may include an electrical connection which is direct or indirect. The terms "on", "under", "right", "left" and the like are only used to indicate relative position relationship, and when an absolute position of the object described is changed, its relative position relationship may be changed accordingly.

In order to avoid adverse effects on the organic light-emitting layer of the OLED resulting from water vapor and oxygen entering the OLED, it is necessary to encapsulate the OLED. At present, encapsulation methods include a thin film encapsulation method and an edge coating encapsulation method, wherein the thin film encapsulation method employs a multi-layer stacked structure of organic layers and inorganic layers; the edge coating encapsulation method, for example, comprises adding a sheet desiccant in a non-display region or applying a circle of desiccant at the edge of the display, but the edge coating encapsulation method is un-preferred for a narrow frame design. Inventors of the present disclosure have found that it is inconvenient to detect whether water vapor, oxygen, and the like have adverse effects on the OLED prior to encapsulation of the OLED. If water vapor and oxygen can be found in the OLED prior to encapsulation, it may be convenient to remove water and oxygen prior to encapsulation. After encapsulation of the OLED, it is inconvenient to detect whether water vapor and oxygen are completely removed. Thus, residual water vapor and oxygen will have adverse effects on the organic light-emitting layer, thereby reducing the lifetime of the OLED. Therefore, it is desirable to carry out real-time detection of the presence of water vapor and oxygen in the OLED, and the detection process should be convenient and easy so as to ensure that the OLED will not be affected by water vapor and oxygen, thereby prolonging the service life of the OLED.

At least one embodiment of the present disclosure provides a composite film comprising a hydrophobic film layer and a hydrophilic film layer, wherein the hydrophobic film layer is in contact with the hydrophilic film layer, and the hydrophilic film layer forms folds under an action of water vapor. It is possible to achieve real-time detection of whether water vapor and the like enter an organic light-emitting display device by using the composite film in the organic light-emitting display device, and thus the adverse effects of water vapor on the organic light-emitting display device can be eliminated timely.

For example, FIG. 1 is a schematic diagram of a composite film according to an embodiment of the present disclosure. As illustrated in FIG. 1, a composite film 10 comprises a hydrophobic film layer 11 and a hydrophilic film layer 12 which are laminated, wherein the hydrophilic film layer 12 comprises a first hydrophilic portion 121 and a second hydrophilic portion 122. The first hydrophilic portion 121 has a hydrophilicity greater than that of the second hydrophilic portion 122, and the first hydrophilic portion 121 forms folds under an action of water vapor.

It shall be noted that the materials of the first hydrophilic portion 121 and the second hydrophilic portion 122 may be the same, and their different hydrophilicities can be achieved by a treatment such as a crosslinking reaction, and the second hydrophilic portion 122 may be modified to reduce its hydrophilicity, even to have almost no hydrophilicity, and thus sensitivity of the first hydrophilic portion 121 to water vapor is far greater than sensitivity of the second hydrophilic portion 122. Alternatively, the materials of the first hydrophilic portion 121 and the second hydrophilic portion 122 may be different, and their different hydrophilicities may result from the difference between the material of the first hydrophilic portion 121 and the material of the second hydrophilic portion 122.

It shall be also noted that the folds may be seen directly by the naked eye or by simple tools such as a magnifying glass.

For example, in the composite film according to at least one embodiment of the present disclosure, the hydrophobic film layer has a modulus of from about 10 kPa to about 40 kPa. For example, the hydrophobic film layer has a modulus of about 10 kPa, 20 kPa, 30 kPa or 40 kPa.

It shall be noted that modulus refers to a ratio of stress to strain of a material in a stress state. For example, elastic modulus can be regarded as an index to measure the tendency of elastic deformation. The greater the value of elastic modulus, the greater the stress required for a certain elastic deformation. That is, the greater the stiffness of the material, the smaller the elastic deformation under the action of a certain stress.

It should be also noted that, the greater the elastic modulus of the hydrophobic film layer, the greater the extrusion force the hydrophobic film layer would exert on the hydrophilic material in contact with the hydrophobic film layer upon being brought into contact with water vapor. The greater extrusion force results in a greater deformation of the hydrophilic film layer. However, the elastic modulus of the hydrophobic film layer is not as great as possible. For example, the composite film needs to be flexible if it is used in a flexible display device. Therefore, the modulus of the hydrophobic film layer should be limited.

For example, in the composite film according to at least one embodiment of the present disclosure, the hydrophobic film layer comprises polydimethylsiloxane (PDMS) and the hydrophilic film layer comprises polyvinyl alcohol (PVA).

The method for preparing a PVA film is not specifically defined in the present disclosure. For example, the PVA film may be manufactured by a solution casting method: heating and dissolving PVA and optional additives in distilled water or DMSO to form a casting solution; filtering, maintaining a constant temperature and static defoaming under different temperature conditions; and applying the casting solution quickly and subjecting to water bath containing sodium sulfate to form a film. The raw material of PVA may be PVA (n=1799) (available from Tianjin Letai Chemical Co., Ltd.), and the additive is, for example, polyethylene glycol (PEG400, PEG600, PEG1000).

The film-forming method of polydimethylsiloxane is not specifically defined in the present disclosure. For example, the film of polydimethylsiloxane (PDMS) may be formed by the following method: adding a curing agent to a PDMS pre-polymer (PDMS pre-polymer and curing agent are available from Beijing Second Chemical Plant), wherein a mass ratio of the pre-polymer to the curing agent is about 10:1, then continuing stirring for about 8 min; placing the mixture in a vacuum glove box for vacuum filtration for about 20 min, spin coating the mixture on a cleaned substrate, and then putting the substrate into an oven for curing to obtain the PDMS film.

For example, the hydrophilicity of some regions of the polyvinyl alcohol (PVA) layer may be changed by crosslinking reaction. For example, in the presence of oxygen, the PVA layer is crosslinked by ultraviolet irradiation, which changes the hydrophilicity of some regions of the PVA layer. The specific process of crosslinking reaction is as follows: placing the PVA in an oxygen environment and irradiating the PVA by an UV-A light with a wavelength of about 365 nm, wherein the PVA is about 10 cm away from the lamp tube, the irradiation temperature is about 293 K, and the irradiation time is about 2 hours. The principle of reducing the hydrophilicity of the PVA by being crosslinked under oxidizing irradiation is that the hydrogen bond between macromolecules formed by —OH groups is partly destroyed, and the hydrophilicity of the PVA crosslinked is reduced.

If PVA is brought into contact with water vapor, folds will be generated in the un-crosslinked portion of the hydrophilic film, and its transparency is changed. The modulus of the crosslinked portion increases due to crosslinking, and no fold is produced in that portion, and its transparency is unchanged. The folds formed have strong refraction and diffuse reflection for visible light, so that the folded region looks more opaque and non-reflective than the non-folded region on the macro level. As the modulus of the PVA film increases and maintains a certain strength due to crosslinking, the structure of the fold produced is stable under the action of water vapor. Once the drying process begins, the PVA film begins to de-swell and relax so as to smooth the fold structure. The composite film has an excellent reversibility and a quick response to water vapor.

Figure 2:
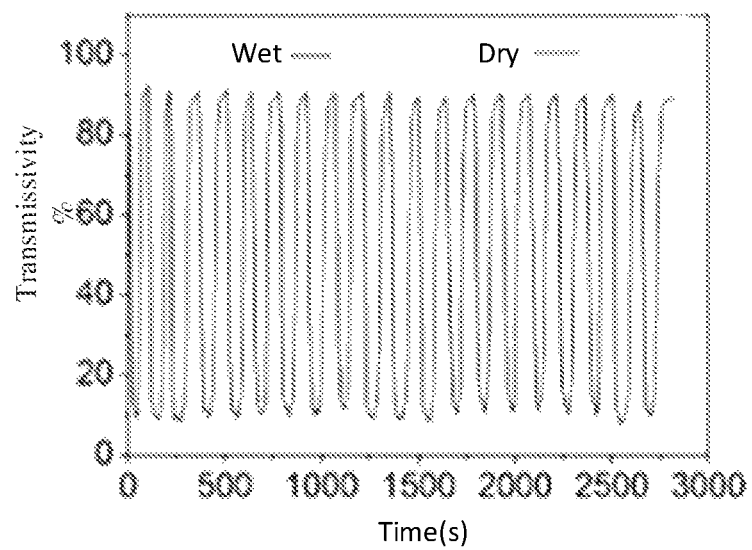
FIG. 2 schematically shows a change in transparency of a hydrophilic film layer according to an embodiment of the present disclosure upon changing dryness and humidity.

For example, FIG. 2 is a schematic diagram of the change in transparency of a hydrophilic film layer under conditions of changing dryness and humidity. As can be seen from FIG. 2, in each pair of vertical lines separated from each other, the left line shows transparency under dry conditions, and the right line shows transparency under wet conditions. For example, when the transparency of the hydrophilic film layer is initially about 10%, it will increase rapidly to about 90% upon being dried, and will decrease rapidly to about 10% upon encountering water vapor again. FIG. 2 shows that the hydrophilic film layer is very sensitive to water vapor, so that the water vapor in the hydrophilic film layer can be detected in time, and the change in the transparency of the folds is apparent, which can be identified by the naked eye or simple tools.

If no water vapor enters the PVA hydrophilic film, the hydrophilic film will be highly transparent. If water vapor is detected in the composite film formed by a PDMS layer and a partially crosslinked PVA layer, the hydrophilic un-crosslinked PVA film will swell, while the hydrophobic PDMS substrate does not swell, so the PDMS substrate exerts compressive force on the PVA layer.

If the composite film is subjected to the external environment, the interface will be subjected to compressive stress due to different physical properties of the two-phase materials of the composite film. The formula 1-1 shows how to calculate the stress.

$$F = E_s \left[ \left(\frac{\pi}{\lambda}\right)^2 \frac{wt^3}{3(1-v_s^2)} + \frac{\lambda}{\pi} \cdot \frac{E_f w}{4(1-v_f^2)E_s} \right] \quad (1\text{-}1)$$

wherein λ is the wavelength of the wrinkle; w and t are the width of the film and the thickness of the surface thin layer respectively; E and v are the elastic modulus and Poisson's ratio respectively; and subscripts s and f means the substrate layer and the surface thin layer. If the stress accumulates to a critical value, wrinkles will be formed on the surface of the hydrophilic material to release energy in order to reduce the overall energy of the composite film. If the composite film is subjected to small strain (ε<5%), the period and amplitude of the wrinkle are as illustrated in Eq. 1-2, 1-3, respectively.

$$\lambda_0 = 2\pi t \left[ \frac{(1-v_s^2)E_f}{3(1-v_f^2)E_s} \right]^{1/3} \quad (1\text{-}2)$$

$$A_0 = t\sqrt{\frac{\varepsilon_{pre}}{\varepsilon_c} - 1} \quad (1\text{-}3)$$

wherein $\lambda_0$ and $A_0$ are the wrinkle period and amplitude under a small strain model; $\varepsilon_{pre}$ is the pre-strain of the composite film; $\varepsilon_C$ is the critical strain for wrinkling of the composite film, the value of which is related to the elastic modulus of the composite film. The formula for calculating $\varepsilon_C$ is shown in 1-4:

$$\varepsilon_c = \frac{1}{4}\left[\frac{3(1-v_f^2)E_s}{(1-v_s^2)E_f}\right]^{2/3}. \quad (1\text{-}4)$$

If the composite film is subjected to a large strain (ε>5%), the wrinkle period and amplitude λ are calculated by using the formulae as illustrated in 1-5 and 1-6.

$$\lambda = \frac{\lambda_0}{(1+\varepsilon_{pre})\left[1 + \frac{5\varepsilon_{pre}(1+\varepsilon_{pre})}{32}\right]^{1/3}} \quad (1\text{-}5)$$

$$A = \frac{A_0}{\sqrt{1+\varepsilon_{pre}}\left[1 + \frac{5\varepsilon_{pre}(1+\varepsilon_{pre})}{32}\right]^{1/3}} \quad (1\text{-}6)$$

Figure 3:
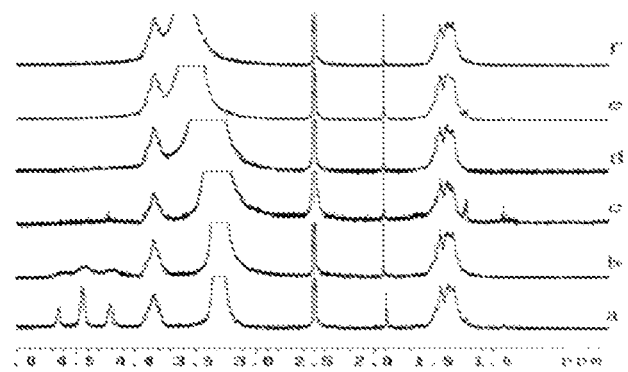
FIG. 3 is a nuclear magnetic resonance spectroscopy of a hydrophilic film layer according to an embodiment of the present disclosure after a crosslinking reaction under irradiation for different durations.
Figures 1, 4:
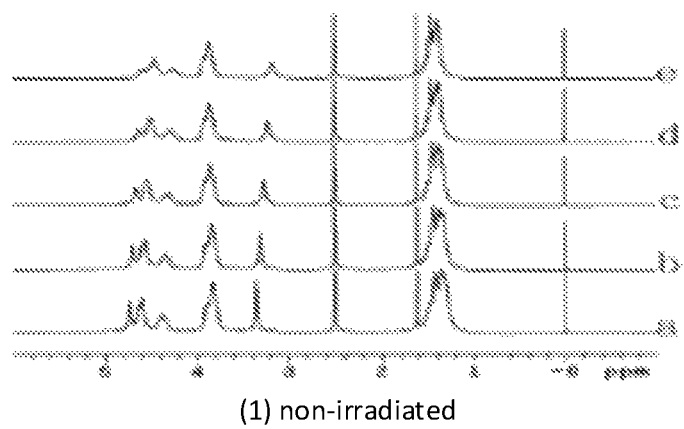
Figures 2, 4:
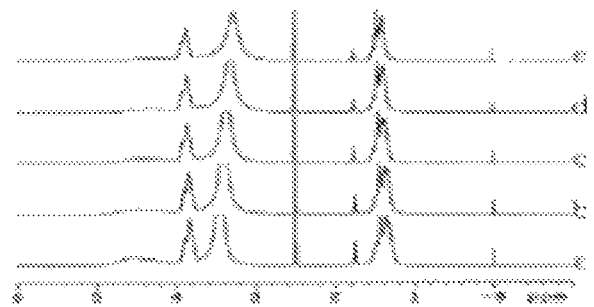

FIG. 3 is a nuclear magnetic resonance spectroscopy of a hydrophilic film layer according to an embodiment of the present disclosure after crosslinking reaction under irradiation for different durations. FIG. 4-1 and FIG. 4-2 are respectively nuclear magnetic resonance spectrum of a hydrophilic film layer according to an embodiment of the present disclosure at different temperatures before and after cross-linking. In order to study the effects of different crosslinking time and temperatures on the crosslinking reaction of PVA, PVA irradiated by UV-A with a wavelength of about 365 nm is dissolved in DMSO, and then a hydrogen nuclear magnetic resonance (HNMR) spectroscopy is obtained by a nuclear magnetic resonance spectrometer.

For example, in FIG. 3, (a), (b), (c), (d), (e), and (f) are nuclear magnetic resonance spectrum when the ultraviolet irradiation time is about 0 h, 1 h, 2 h, 3 h, 4 h and 5 h, respectively. As illustrated in FIG. 3 (a), in the hydrogen nuclear magnetic resonance spectroscopy of PVA not irradiated with UV, the signals of the protons are as follows: δ 1.33~1.45 are a —$CH_2$ proton signal, δ 3.84 is a —CH proton signal, δ 4.19~4.64 includes three —OH proton signals, and δ 3.30 is the chemical shift of a water proton in the DMSO solvent. As can be seen from (b), (c), (d), (e) and (f) of FIG. 3, as the ultraviolet irradiation time increases, the intensity of the proton peak of the —OH group decreases gradually until it finally disappears. Meanwhile, the water proton peak becomes wider gradually and moves toward the low field direction. This is because the PVA macromolecular chain contains a large number of —OH groups, which may readily form intramolecular hydrogen bonds or intermolecular hydrogen bonds. After UV irradiation, the energy of the PVA film increases. On one hand, some hydrogen bonds are destroyed, and part of —OH groups is "released". Such released —OH groups form new hydrogen bonds with water in the solvent, and the electrostatic shielding effect thereof is enhanced. On the other hand, the exchange between the active proton of —OH groups and the residual water protons of the solvent DMSO-d6 accelerates. As a result of the formation of such hydrogen bonds and the rapid exchange of active protons, the water proton peak and the hydroxyl proton peak become closer to each other, the —OH group peak gradually disappears, and the water proton peak becomes wider gradually and shifts to the low field direction. As such, as the time of ultraviolet irradiation increases, the hydrophilicity of the PVA film layer which is crosslinked becomes weaker.

As can be seen from FIG. 3, as the irradiation time of PVA by UV light increases, the peak area and position of the —$CH_2$ proton peak are hardly changed, while the peak area of the —CH proton peak is changed. This indicates that in PVA macromolecular chains, a large number of —OH groups connected to —CH form new hydrogen bonds with water molecules in the solvent although part of the hydrogen bonds between PVA molecules are destroyed after UV irradiation. The existence and relative strength of these two hydrogen bonds affect the movement of —CH groups, thus increasing the peak area. In contrast, —$CH_2$ protons are not directly connected to —OH groups and not affected by hydrogen bonds, and thus the peak area and position of the —$CH_2$ proton peak are hardly changed. In conclusion, formation of hydrogen bonds and exchange of protons between —OH groups and solvent residual water protons before and after the UV irradiation on PVA not only affect the chemical shift of the water proton peak, but also affect the movement of the macromolecular —CH proton, which is related to the destruction of some hydrogen bonds in the aggregated structure after PVA is irradiated by ultraviolet.

FIG. 4-1 and FIG. 4-2 are respectively nuclear magnetic resonance spectrum of a hydrophilic film layer according to an embodiment of the present disclosure at different temperatures before and after cross-linking. For example, FIG. 4-1 shows nuclear magnetic resonance spectrum of PVA in DMSO-d6 before ultraviolet irradiation at different temperatures. For example, FIGS. 4-1 (a), 4-1 (b), 4-1 (c), 4-1 (d) and 4-1 (e) are hydrogen nuclear magnetic resonance spectrum of PVA before ultraviolet irradiation at temperatures of about 293K, 303K, 313K, 323K and 333K, respectively. FIG. 4-2 shows nuclear magnetic resonance spectrum of PVA in DMSO-d6 after UV irradiation at different temperatures for about 5 hours. FIGS. 4-2 (a), 4-2 (b), 4-2 (c), 4-2 (d) and 4-2 (e) are nuclear magnetic resonance spectrum of PVA in DMSO-d6 after ultraviolet irradiation at temperatures of 293K, 303K, 313K, 323K and 333K for about 5 hours, respectively. By comparison of 1H NMR spectrum of PVA in DMSO-d6 at varied temperatures before and after irradiation, as the temperature increases, the resonance peaks of —OH groups of PVA and DMSO-d6 gradually become weaker and show a trend of moving. As the temperature increases, the chemical shift of —OH protons in non-irradiated PVA changes from δ 4.60 to δ 4.46, and the chemical shift of water protons changes from δ 3.36 to δ 3.17; after irradiation, the chemical shift of —OH protons in PVA changes from δ 4.55 to δ 4.31, and the chemical shift of water protons changes from δ 3.44 to δ 3.26. The peaks of —OH and residual water proton in the solvent move toward a high field direction gradually. This is because on one hand, the exchange of —OH and water protons is accelerated as the temperature increases, which weakens the —OH proton peak; on the other hand, the hydrogen bonds between —OH and solvent residual water protons become weaker gradually as the temperature increases, enabling the peaks of hydroxyl and solvent residual proton water to shift to a high field. However, in 1H NMR spectrum of irradiated PVA in DMSO at varied temperatures, the change trend is more significant, which is related to the increase of energy of the PVA system and the partial destruction of hydrogen bonds between macromolecules formed by —OH groups after ultraviolet irradiation. After irradiation, the "released" —OH group is more likely to exchange with residual proton water in the solvent, so the —OH group of the irradiated sample disappears faster.

For example, in the composite film according to at least one embodiment of the present disclosure, a ratio of a thickness of the hydrophobic film to a thickness of the hydrophilic film is from about 1:1 to about 3:1. For instance, the ratio of the thickness of the hydrophobic film to the thickness of the hydrophilic film is about 1:1, 2:1 or 3:1. For example, the hydrophilic film has a thickness of from about 1.0 to 3.0 μm. For instance, the hydrophilic film has a thickness of about 1.0 μm, 1.9 μm or 3.0 μm, and the corresponding hydrophobic film has a thickness of about 3.0 μm, 5.7 μm or 9.0 μm.

Figure 5:
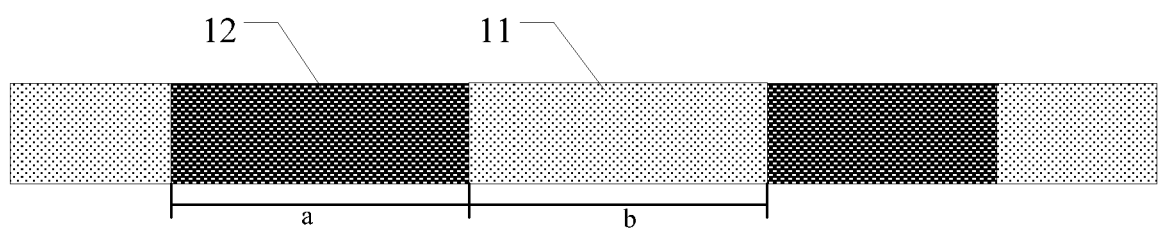
FIG. 5 is a schematic diagram of another composite film according to an embodiment of the present disclosure.

FIG. 5 is a schematic diagram of another composite film according to an embodiment of the present disclosure. As illustrated in FIG. 5, the hydrophobic film layer 11 and the hydrophilic film layer 12 are provided in the same layer. The hydrophilic film layer 12 comprises a plurality of hydrophilic regions a which are spaced apart from each other, and the hydrophobic film layer 11 comprises a plurality of hydrophobic regions b which are spaced apart from each other. One of the hydrophobic regions b is provided between two adjacent hydrophilic regions a.

It should be noted that in the composite film, the hydrophilic film material can be any hydrophilic material and the hydrophobic film material can be any hydrophobic material, as long as the melting point, transparency, flexibility and the like thereof can meet the process conditions for manufacturing the light-emitting display device subsequently.

For example, the material of the hydrophilic film is polyvinyl alcohol or polyacrylic alcohol.

For example, the material of the hydrophobic film is a transparent resin, wherein the transparent resin may comprise: polymethyl methacrylate (PMMA), polycarbonate (PC), polystyrene (PS), polyethylene terephthalate (PET), poly (ethylene terephthalate-co-1,4-cylclohexylenedimethylene terephthalate) (PETG), acrylonitrile-butadiene-styrene copolymer (ABS), polypropylene (PP), styrene/acrylonitrile copolymer (SAN, also known as AS), methyl methacrylate-butadiene-styrene copolymer (MBS), polyether sulfone (PES), diallyl diethylene glycol carbonate polymer (CR-39), polymethyl-1-pentene (TPX), polyhydroxyethyl methacrylate (HEMA), cellulose acetate, cellulose nitrate, or ethylene-vinyl acetate copolymer (EVA), etc.

At least one embodiment of the present disclosure further provides a light-emitting display device comprising any composite film as described above and a light-emitting element.

For example, the light-emitting element is an organic light-emitting diode (OLED), which comprises a first electrode, an organic functional layer and a second electrode which are stacked. The organic functional layer comprises a light-emitting layer, and may further comprise an electron injection layer, an electron transport layer, a hole injection layer, and a hole transport layer.

For example, the material of the light-emitting layer can be selected according to the different colors of the light emitted. In addition, according to the requirements, the organic light-emitting material in the embodiments of the present disclosure may comprise a fluorescent light-emitting material or a phosphorescent light-emitting material. At present, a doping system is generally used, that is, the useful light-emitting material is obtained by incorporating a doping material into a main light-emitting material. For example, the main light-emitting material may be selected from metal compounds, anthracene derivatives, aromatic diamines, triphenylamine compounds, aromatic triamines, biphenyldiamine derivatives, or triarylamine polymers etc. For example, the main light-emitting material may be bis(2-methyl-8-quinolinolato-N1,O8)-(1,1'-biphenyl-4-olato)aluminum (Balq), 9,10-di-(2-naphthyl)anthracene (ADN), TAZ, 4,4'-bis(carbazol-9-yl)biphenyl (CBP), MCP, 4,4',4"-tris(carbazol-9-yl)-triphenylamine (TCTA) or N,N'-bis-(1-naphthalenyl)-N,N'-bis-phenyl-(1,1'-biphenyl)-4,4'-diamine (NPB), and the like. Fluorescent light-emitting materials or doping materials include, for example, coumarin dyes (coumarin 6, C-545T), quinacridone (DMQA), or 4-(dicyanomethylene)-2-methyl-6-(4-dimethylamino-styryl)-4H-pyran (DCM), and the like. Phosphorescent light-emitting materials or doping materials include, for example, light-emitting materials based on metal complexes of Ir, Pt, Ru, Os and as the like. For example, phosphorescent light-emitting materials or doping materials include FIrpic, $Fir_6$, $FirN_4$, FIrtaz, $Ir(ppy)_3$, $Ir(ppy)_2(acac)$, PtOEP, $(btp)_2Iracac$, $Ir(piq)_2(acac)$ or $(MDQ)_2Irac$, and the like. In addition, the light-emitting material may also include two hosts doped.

For example, the red light-emitting layer is manufactured by doping 4,4'-bis(N-carbazolyl)-1,1'-biphenyl with 5,6,11,12-tetraphenyl-tetracene, where the doping ratio of 4,4'-bis (N-carbazolyl)-1,1'-biphenyl to 5,6,11,12-tetraphenyl-tetracene is 97:3.

For example, the green light-emitting layer is manufactured by doping 1,3,5-tris(bromomethyl)benzene with N,N'-dimethylquinacridone, wherein the doping ratio of 1,3,5-tris (bromomethyl)benzene to N,N'-dimethylquinacridone is 85:15.

For example, the blue light-emitting layer is manufactured by doping 3-tert-butyl-9,10-di(2-naphthalene)anthracene with 2,5,8,11-tetra-tert-butyl perylene, wherein the doping ratio of 3-tert-butyl-9,10-di(2-naphthalene)anthracene to 2,5,8,11-tetra-tert-butyl perylene is 95:5.

For example, the hole blocking material may include 2-(4-biphenylyl)-5-phenyl-1,3,4-oxadiazole, 2-(4-biphenylyl)-5-(4-tert-butylphenyl)-1,3,4-oxadiazole (PBD), 3-(biphenyl-4-yl)-5-(4-tert-butylphenyl)-4-phenyl-4H-1,2,4-triazole (TAZ), 1,3,5-tri(1-phenyl-1H-1-benzimidazole-2-yl) benzene (TPBI), oxalines, triphenylquinoline (TPQ), acridines, 2,6-bis(biphenyl)-4,8-diphenyl anthrazoline, phenanthroline derivatives, 4,7-diphenyl-1,10-phenanthroline, 2,9-dimethyl-4,7-biphenyl-1,10-phenanthroline (BCP), etc.

For example, the electron blocking material may include $MoO_3$, $Cs_2CO_3$, CsF, LiF, Al, $Ir(ppz_3)$ and the like.

For example, the hole transport layer can be made of, an aromatic diamine compound, a triphenylamine compound, an aromatic triamine compound, a biphenyldiamine derivative, a triarylamine polymer, or a carbazole polymer. For example, the hole transport layer can be made of NPB, TPD, TCTA, polyvinyl carbazole or monomers thereof.

For example, the electron transport layer may comprise any one of: 4,7-diphenyl-1,10-phenanthroline, 2,9-bis(naphthalene-2-yl)-4,7-diphenyl-1,10-phenanthroline, 4,7-diphenyl-1,10-phenanthroline, 2,9-dimethyl-4,7-biphenyl-1,10-phenanthroline, and 8-hydroxyquinoline aluminum. The material of the electron transport layer can also be 8-hydroxyquinoline lithium (Liq), 8-hydroxyquinoline gallium, bis[2-(2-hydroxyphenyl-1)-pyridine]beryllium, 2-(4-diphenyl)-5-(4-tert-butylphenyl)-1,3,4-oxadiazole (PBD), 1,3,5-tri(N-phenyl-2-benzimidazole-2)benzene (TPBI), BCP, Bphen, etc.

For example, the electron injection layer may comprise LiF, 8-hydroxyquinoline lithium or a combination thereof. The electron injection layer can also use alkali metal oxides or alkali metal fluorides. Alkali metal oxides may include lithium oxide ($Li_2O$), lithium boron oxide ($LiBO_2$), potassium silicate ($K_2SiO_3$), cesium carbonate ($Cs_2CO_3$), etc. Alkali metal fluorides may include sodium fluoride (NaF) and the like.

For example, the hole injection layer may comprise any one of poly(3,4-ethylenedioxythiophene)-polystyrene sulfonic acid (PEDOT/PSS), polythiophene, and polyaniline. The material of the hole injection layer may also be tri-[4-(5-phenyl-2-thienyl)benzene]amine, 4,4',4"-tri[2-naphthyl(phenyl)amino] triphenylamine (2-TNATA), 4,4',4"-tri-(3-methylphenylanilino)triphenylamine (m-MTDATA), copper phthalocyanine (CuPc) or TPD.

For example, one of the first electrode and second electrode is an anode and the other one is a cathode.

For example, the material forming an anode of an OLED may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), or carbon nanotubes.

For example, the material forming a cathode of an OLED may include magnesium aluminum alloy (MgAl), lithium aluminum alloy (LiAl), magnesium, aluminum, or lithium. In order to obtain a top or bottom emitting mode, a reflecting layer can be individually formed in the OLED.

Figure 6:
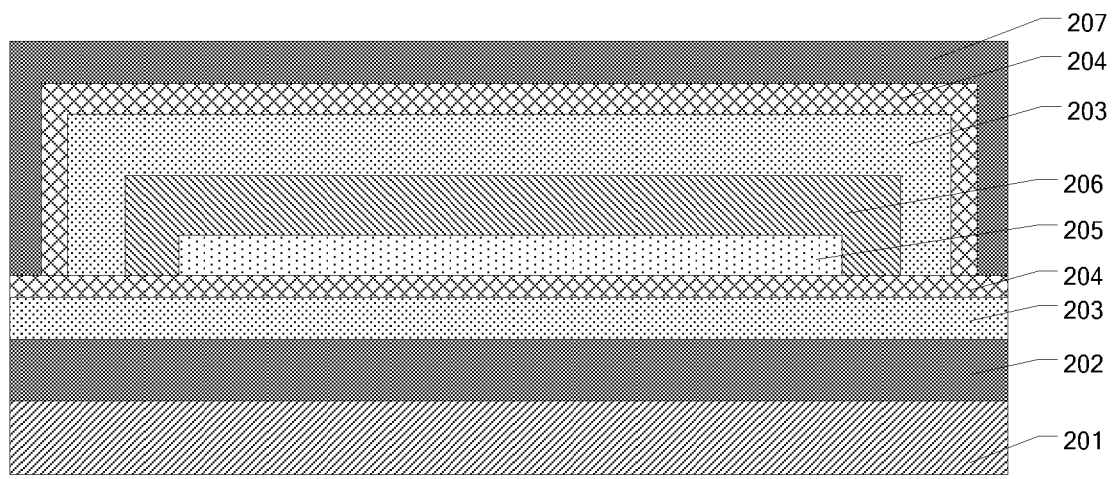
FIG. 6 schematically shows a cross-sectional structure of a light-emitting display device according to an embodiment of the present disclosure.

For example, FIG. 6 is a schematic diagram of a cross-sectional structure of a light-emitting display device according to an embodiment of the present disclosure. As illustrated in FIG. 6, the light-emitting display device comprises a base substrate 201, a first barrier layer 202, a hydrophobic film layer 203, a hydrophilic film layer 204, an OLED light-emitting element 205, an OLED drying layer 206, a hydrophobic film layer 203, a hydrophilic film layer 204, and a second barrier layer 207 sequentially provided on the base substrate 201.

For example, the base substrate 201 is a glass film substrate, a stainless steel film substrate or a plastic substrate, wherein the plastic substrate can be made of polyimide (PI), polyethylene terephtalate (PET), polyethersulfone (PES) or polycarbonate (PC).

For example, the material of the OLED drying layer may include soda lime (a mixture of CaO, NaOH and KOH) or quick lime (CaO).

For example, the first barrier layer 202 and the second barrier layer 207 are formed by solidification of a sealing adhesive or a glass adhesive. For example, the material of the sealing adhesive is a vinyl acetate-ethylene copolymer, the material of the first barrier layer 202 and the second barrier layer 207 may be a polyimide film (PI film). The polyimide film is formed by condensation of pyromellitic dianhydride (PMDA) and diaminodiphenyl ether (DDE) in a strong polar solvent, casting into a film, and then imidization.

For example, the composite film comprising a hydrophobic film layer 203 and a hydrophilic film layer 204 is provided on a light-exiting side and an opposite side of the light-exiting side of the OLED light-emitting element 205. Film layers are susceptible to rupture upon tearing the first barrier layer 202 off from the base substrate 201, and thus water vapor may easily enter from the rupture of the film layers. Therefore, it is desired to provide a composite film between the first barrier layer 202 and the OLED light-emitting element. The second barrier layer 207 needs to contact the conveyor belt when the OLED light-emitting elements formed are transmitted. The second barrier layer 207 is likely to be worn down during transmission, so that water vapor and other materials can easily enter from the rupture of the film layers. Therefore, it is desired to provide a composite film between the second barrier layer 207 and the light-emitting element.

It should be noted that, the composite film may be provided only on the light-exiting side or the opposite side of the light-exiting side of the light-emitting element according to different conditions. For example, the light-emitting element may be of a double-sided light-exiting type, and the composite film comprising a hydrophobic film layer 203 and a hydrophilic film layer 204 may be provided on both the light-exiting side and the opposite side of the light-exiting side of the light-emitting element 205.

For example, the light-exiting side of the light-emitting element is a side from which light exits.

For example, the composite film may be provided on the light-exiting side of the light-emitting element, and the side of the composite film away from the light-emitting element is provided with a second barrier layer 207.

For example, the composite film may be provided on the opposite side of the light-exiting side of the light-emitting element, and the side of the composite film away from the light-emitting element is provided with a first barrier layer 202.

For example, the OLED may further comprise an encapsulation film, and encapsulation film at least comprises an inorganic insulating layer and an organic insulating layer which are stacked.

For example, the inorganic insulating layer may comprise a first inorganic insulating layer disposed between the organic insulating layer and the OLED drying layer, and a second inorganic insulating layer disposed on the organic insulating layer.

For example, the first inorganic insulating layer and the second inorganic insulating layer in the encapsulation film can serve to block water vapor and oxygen. The first inorganic insulating layer and the second inorganic insulating layer may have poor bending ability and may be easy to break when they are bent. The organic insulating layer sandwiched between the first inorganic insulating layer and the second inorganic insulating layer can release stress so as to reduce the damage caused by bending process to the first inorganic insulating layer and the second inorganic insulating layer, and can also play a flattening role. It should be noted that in addition to the first inorganic insulating layer and second inorganic insulating layer, the encapsulation film can also include more inorganic insulating layers which are stacked so as to better block water vapor and oxygen. The encapsulation film formed by the first inorganic insulating layer, the second inorganic insulating layer and the organic insulating layer not only meets the requirements of blocking water vapor and oxygen, but also facilitates the narrow-frame design of OLED display devices.

At least one embodiment of the present disclosure further provides a method for manufacturing a composite film comprising a hydrophobic film layer and a hydrophilic film layer, the method comprising: forming a hydrophobic film layer and a hydrophilic film layer sequentially, wherein the hydrophobic film layer is in contact with the hydrophilic film layer, and the hydrophilic film layer forms folds under the action of water vapor.

For example, the method further comprises crosslinking the hydrophilic film layer to form a first hydrophilic portion and a second hydrophilic portion, wherein the hydrophilicity of the first hydrophilic portion is greater than that of the second hydrophilic portion, and the first hydrophilic portion forms folds under the action of water vapor.

FIG. 7(a)-7(f) show a flowchart of a process for manufacturing a composite film according to an embodiment of the present disclosure.

Figure 7A:
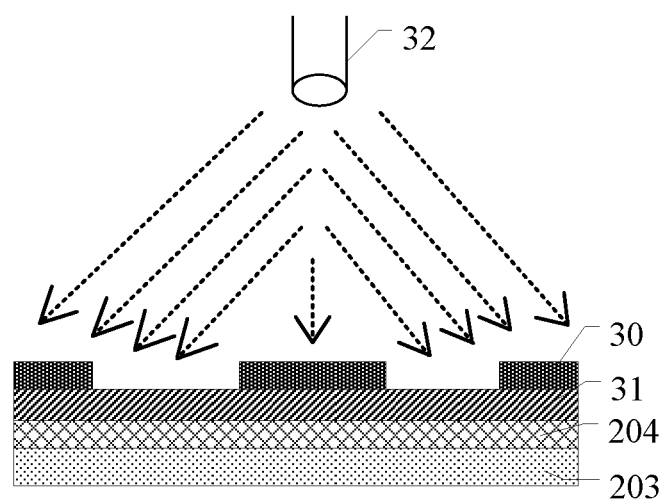
FIG. 7(a) to FIG. 7(f) show a flowchart of a process for manufacturing a composite film according to an embodiment of the present disclosure.
Figure 7B:
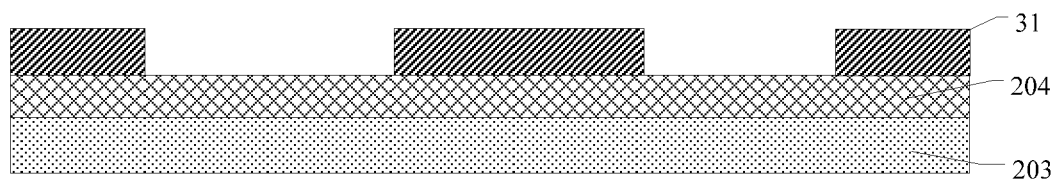

As illustrated in FIG. 7(a), an ultraviolet lamp 32 and a mask 30 are provided, and a photoresist 31 is applied on the hydrophilic film layer 204. The photoresist 31 is patterned by irradiation under ultraviolet light to form a pattern of the photoresist 31. The pattern of the photoresist 31 is illustrated in FIG. 7(b).

Figure 7C:
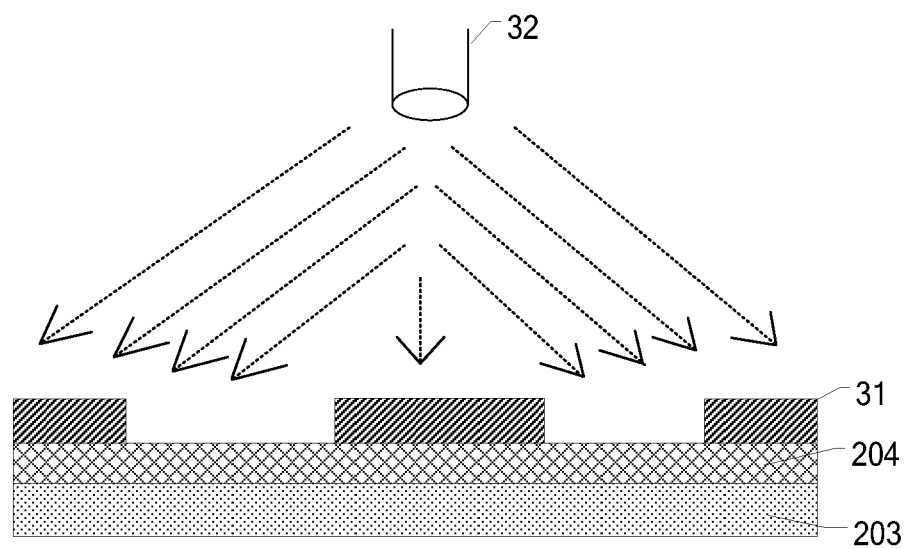
Figure 7D:
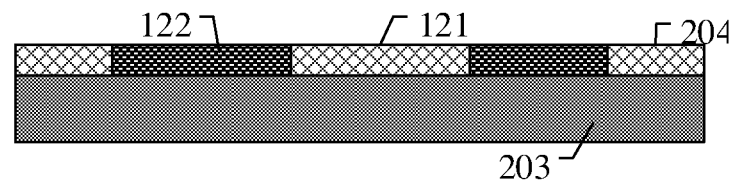

As illustrated in FIG. 7(c), in the presence of oxygen, the portion of the hydrophilic film layer which is not covered with a photoresist pattern is crosslinked by ultraviolet light to form a second hydrophilic portion 122. The hydrophilicity of the first hydrophilic portion 121 is greater than that of the second hydrophilic portion 122. The patterns of the first hydrophilic portion 121 and the second hydrophilic portion 122 are shown in FIG. 7(d).

Figure 7E:
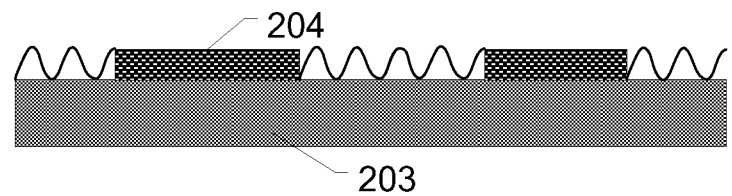
Figure 7:
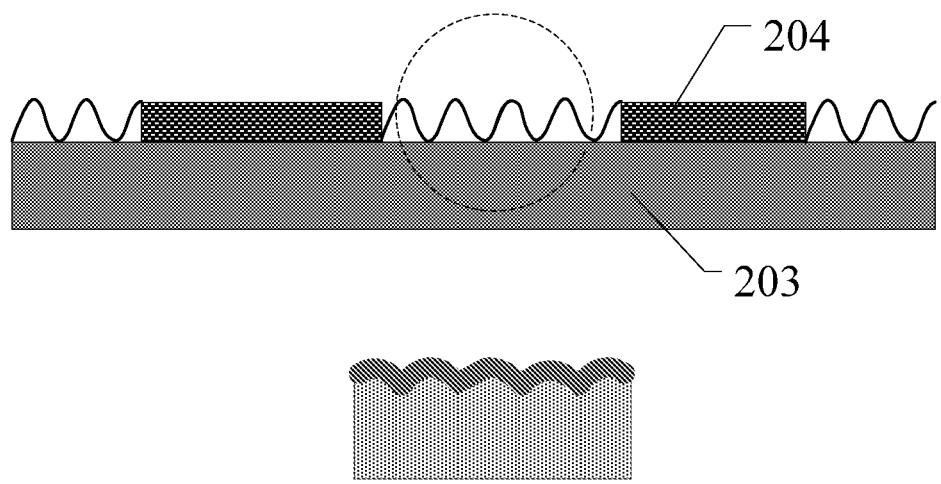

As illustrated in FIG. 7(e), the uncrosslinked portion of the hydrophilic film layer will swell if water vapor enters the partially crosslinked hydrophilic film layer, while the hydrophobic film layer will not swell. Therefore, the hydrophobic film layer will exert compressive force on the hydrophilic film layer to make it form folds.

As illustrated in FIG. 7(f), each folded portion seen at the macro level is formed by a combination of small folds.

For example, the material of the hydrophobic film layer is polydimethylsiloxane, and the material of the hydrophilic film layer is polyvinyl alcohol.

For example, in another embodiment of the present disclosure, forming a hydrophobic film layer and a hydrophilic film layer comprises: forming a hydrophobic film layer which has an opening; and forming a hydrophilic film layer at the opening of the hydrophobic film layer.

For example, in the method according to the present embodiment, forming an encapsulation film at least comprises forming an organic insulating layer by coating, inkjet printing, or printing to achieve a flattening effect.

For example, the method according to the present embodiment may further comprise preparing a first inorganic insulating layer and a second inorganic insulating layer by using a vacuum device, for example, forming a first inorganic insulating layer and a second inorganic insulating layer by plasma enhanced chemical vapor deposition or a sputtering method.

The embodiments of the present disclosure provide a composite film comprising a hydrophobic film layer and a hydrophilic film layer, a manufacture method thereof, and a light-emitting display device, having at least one of the following beneficial effects:

(1) the composite film according to at least one embodiment of the present disclosure forms an opaque fold if water vapor enters the hydrophilic film layer; and (2) the light-emitting display device according to at least one embodiment of the present disclosure can achieve real-time detection of whether water vapor enters the light-emitting display device, thus timely eliminating the adverse effects of water vapor on the light-emitting device.

Please note that:

(1) the drawings of the embodiments of the present disclosure are only related to the structures mentioned in the embodiments of the present disclosure, and other structures can be further obtained by general designs;

(2) for the sake of clarity, in the drawings for describing the embodiments of the present disclosure, sizes of layers or regions are not drawn according to an actual scale but are exaggerated or diminished; it will be understood that when an element such as a layer, a film, a region or a substrate is referred to as being "on" or "under" another element, the element may be "directly" disposed "on" or "under" another element, or there may be an intermediate element; and (3) the embodiments of the present disclosure and the features therein can be combined with each other to obtain new embodiments in the absence of conflict.

What are described above is related to only the illustrative embodiments of the present disclosure and not limitative to the scope of the disclosure. The scope of the present disclosure shall be defined by the accompanying claims.

What is claimed is:

1. A light-emitting display device, comprising:
   a base substrate;
   a first barrier layer, a first composite film, a light-emitting element, a light-emitting element drying layer, a second composite film, and a second barrier layer sequentially provided on the base substrate, wherein both the first composite film and the second composite film comprise a hydrophobic film layer and a hydrophilic film layer, the hydrophobic film layer is in contact with the hydrophilic film layer, and the hydrophilic film layer forms folds under an action of water vapor.

2. The light-emitting display device according to claim 1, wherein the hydrophobic film layer and the hydrophilic film layer are laminated, in the first composite film, the hydrophobic film layer is closer to the first barrier layer than the hydrophilic film layer, and in the second composite film, the hydrophilic film layer is closer to the second barrier layer than the hydrophobic film layer.

3. The light-emitting display device according to claim 1, wherein
   the hydrophilic film layer comprises a first hydrophilic portion and a second hydrophilic portion, the first hydrophilic portion has a hydrophilicity greater than that of the second hydrophilic portion, and the first hydrophilic portion forms folds under an action of water vapor.

4. The light-emitting display device according to claim 3, wherein:
   the hydrophobic film layer and the hydrophilic film layer are arranged in a same layer; and the hydrophilic film layer comprises a plurality of hydrophilic regions spaced apart from each other, and the hydrophobic film layer comprises a plurality of hydrophobic regions spaced apart from each other, wherein any two adjacent hydrophilic regions are separated by one of the hydrophobic regions.

5. A method of manufacturing a light-emitting display device, the method comprises:
providing a base substrate;
sequentially forming a first barrier layer, a first composite film, a light-emitting element, a light-emitting element drying layer, a second composite film, and a second barrier layer on the base substrate, wherein both the first composite film and the second composite film comprise a hydrophobic film layer and a hydrophilic film layer, the hydrophobic film layer is in contact with the hydrophilic film layer, and the hydrophilic film layer forms folds under an action of water vapor.

6. The method according to claim 5, further comprising: crosslinking the hydrophilic film layer to form a first hydrophilic portion and a second hydrophilic portion, wherein the first hydrophilic portion has a hydrophilicity greater than that of the second hydrophilic portion, and the first hydrophilic portion forms folds under the action of water vapor.

7. The method according to claim 6, wherein the crosslinking the hydrophilic film layer to form the first hydrophilic portion and the second hydrophilic portion comprises crosslinking a portion of the hydrophilic film layer by employing a process of ultraviolet irradiation oxidation in an oxygen environment.

8. The method according to claim 7, wherein the forming the hydrophobic film layer and the hydrophilic film layer comprises:
forming the hydrophobic film layer which has an opening; and
forming the hydrophilic film layer at the opening of the hydrophobic film layer.

9. The method according to claim 5, wherein the hydrophobic film layer comprises polydimethylsiloxane, and the hydrophilic film layer comprises polyvinyl alcohol.

10. The method according to claim 6, wherein the hydrophobic film layer comprises polydimethylsiloxane, and the hydrophilic film layer comprises polyvinyl alcohol.

11. The light-emitting display device according to claim 1, wherein the hydrophobic film layer has a modulus of from about 10 kPa to about 40 kPa.

12. The light-emitting display device according to claim 1, wherein the hydrophobic film layer comprises polydimethylsiloxane, and the hydrophilic film layer comprises polyvinyl alcohol.

13. The light-emitting display device according to claim 12, wherein a ratio of a thickness of the hydrophobic film layer to a thickness of the hydrophilic film layer is from about 1:1 to about 3:1.

* * * * *